(12) United States Patent
Hung et al.

(10) Patent No.: US 11,721,602 B2
(45) Date of Patent: Aug. 8, 2023

(54) SEMICONDUCTOR PACKAGE WITH STIFFENER STRUCTURE

(71) Applicant: Taiwan Semiconductor Manufacturing Company, Ltd., Hsinchu (TW)

(72) Inventors: Wensen Hung, Hsinchu County (TW); Yu-Ling Tsai, Hsinchu (TW); Chien-Chia Chiu, Taoyuan (TW); Tsung-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 105 days.

(21) Appl. No.: 17/314,002

(22) Filed: May 6, 2021

(65) Prior Publication Data
US 2022/0359322 A1    Nov. 10, 2022

(51) Int. Cl.
*H01L 23/31*    (2006.01)
*H01L 21/56*    (2006.01)
*H01L 23/12*    (2006.01)

(52) U.S. Cl.
CPC .............. *H01L 23/31* (2013.01); *H01L 21/56* (2013.01); *H01L 23/12* (2013.01)

(58) Field of Classification Search
CPC ....................................................... H01L 23/31
USPC .......................................................... 257/704
See application file for complete search history.

(56) References Cited

U.S. PATENT DOCUMENTS

| | | | |
|---|---|---|---|
| 2011/0018125 A1* | 1/2011 | Loo | H01L 23/16 257/E23.101 |
| 2013/0119529 A1* | 5/2013 | Lin | H01L 23/3675 438/118 |
| 2015/0162307 A1* | 6/2015 | Chen | H01L 21/56 438/107 |
| 2020/0105640 A1* | 4/2020 | Chiu | H01L 23/40 |

* cited by examiner

*Primary Examiner* — Ajay Arora
(74) *Attorney, Agent, or Firm* — JCIPRNET

(57) ABSTRACT

A semiconductor package includes a chip package disposed on a substrate, a plurality of electronic components disposed aside the chip package on the substrate and a stiffener structure disposed on the substrate. The stiffener structure includes a stiffener ring surrounding the chip package and the plurality of electronic components, a stiffener rib between the chip package and the plurality of electronic components, wherein the stiffener rib includes a first portion and a second portion on the first portion, and a width of the second portion is greater than a width of the first portion. The semiconductor package further includes a lid attached to the stiffener structure, the chip package and the plurality of electronic components. A method of forming the semiconductor package is also provided.

20 Claims, 13 Drawing Sheets

SEMICONDUCTOR PACKAGE WITH STIFFENER STRUCTURE

BACKGROUND

In packaging of semiconductor devices, after individual semiconductor dies are manufactured and packaged, the packaged semiconductor dies may be mounted on a packaging substrate with other electronic components, such as other semiconductor dies, to form a semiconductor device. A lid is then attached to the semiconductor device for dissipating the heat generated during the operation; such attachment is through a thermal interface material (TIM) and/or an adhesive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
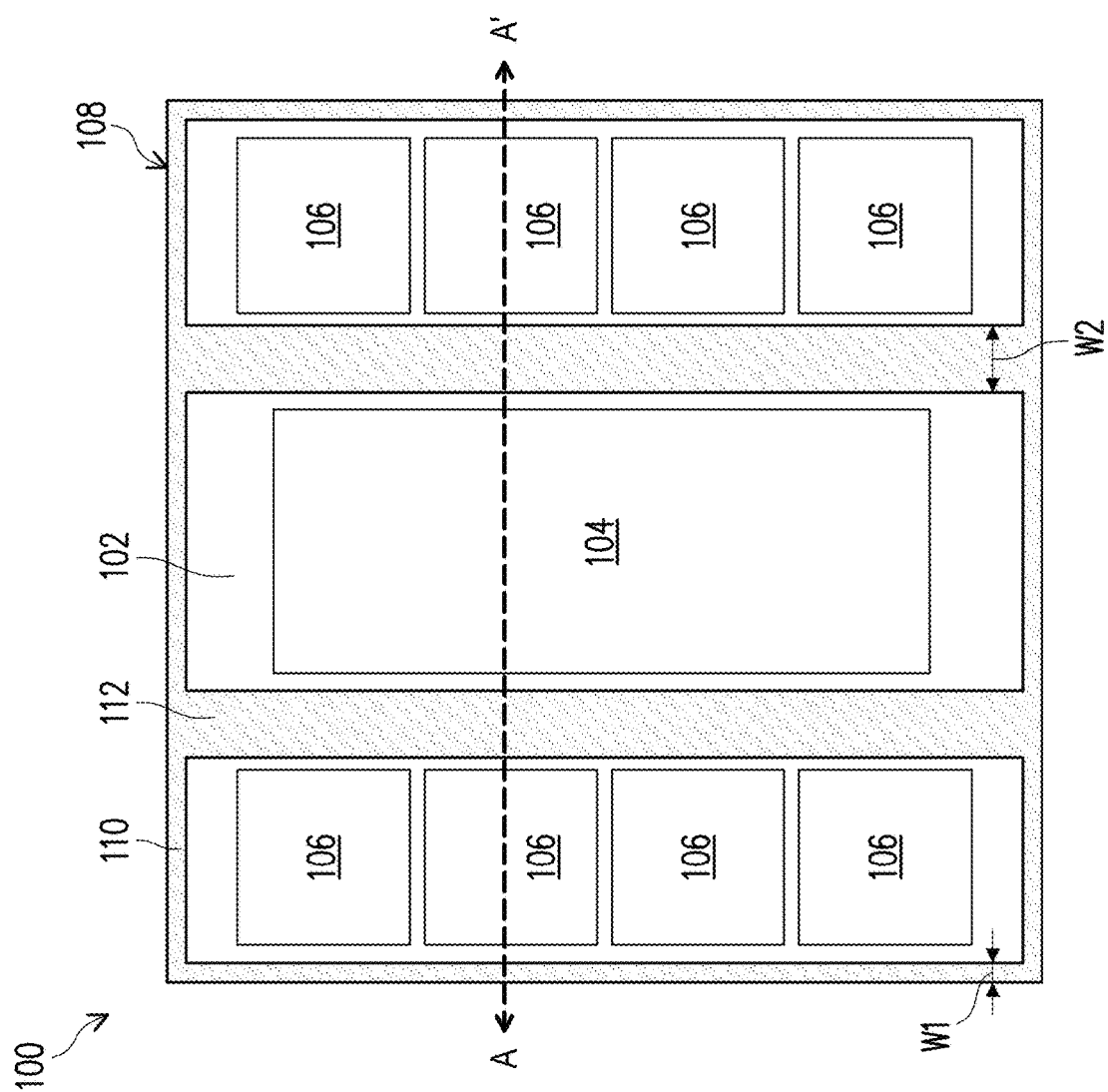
FIG. 1 is a schematic top view of a semiconductor package with a stiffener structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor industry, various chip packages and/or electronic components may be mounted on a packaging circuit substrate to form a semiconductor device. A lid may be attached to the semiconductor device through a thermal interface material (TIM) and/or an adhesive. Usually, the semiconductor devices and the lid are formed of different materials having mismatched coefficient of thermal expansion (CTE). As a result, the semiconductor device and the lid experience significantly different dimensional change under temperature change which may lead to the delamination of TIM and/or the cracking of adhesive.

Figure 2A:
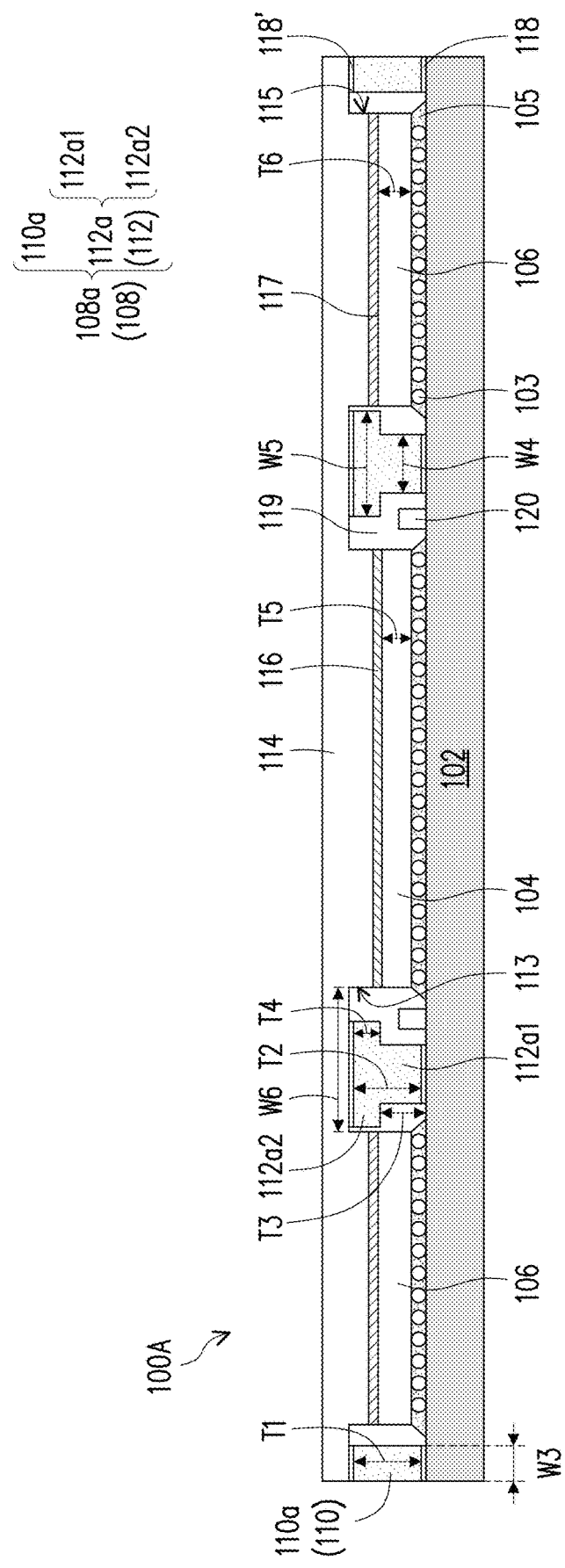
FIGS. 2A through 2D are respectively schematic cross-sectional views of semiconductor packages with various stiffener ribs along line A-A' shown in FIG. 1 in accordance with some embodiments of the present disclosure.

FIG. 1 is a schematic top view of a semiconductor package with a stiffener structure and FIG. 2A is a schematic cross-sectional views of semiconductor packages with various stiffener ribs along line "A-A'" shown in FIG. 1 in accordance with some embodiments of the present disclosure. Referring to FIG. 1 and FIG. 2A, a semiconductor package 100 is provided. The semiconductor package 100 includes a substrate 102, a chip package 104, a plurality of electronic components 106, a stiffener structure 108, and a lid 114. It should be noted that, the lid 114 is not shown in FIG. 1 for a clearer top view of the arrangements in the semiconductor package 100. As shown in FIG. 1 and FIG. 2A, the chip package 104, the plurality of electronic components 106 and the stiffener structure 108 are disposed on the substrate 102, and the lid 114 is attached on the stiffener structure 108 as well as on the chip package 104 and the plurality of electronic components 106.

In some embodiments, the semiconductor package 100 is an integrated fan-out on substrate (InFO-oS) package, a chip on wafer on substrate (CoWoS) package, integrated fan-out large scale integration (InFO-LSI) package, or the like. In some embodiments, the substrate 102 is a ball grid array (BGA) substrate, an interposer or any packaging substrate that may be bonded (e.g. soldered) to a printed circuit board (PCB) through a thermal process (e.g. reflow). In some embodiment, the chip package 104 is a system on chip (SoC), a central processing unit (CPU), a field programmable gate array (FPGA), microcontrollers, or the like. In some embodiments, the electronic components 106 is memory devices (e.g., memory chips or memory packages). In some embodiments, the electronic components 106 is memory devices such as high bandwidth memories (HBM), dynamic random access memories (DRAM), static random access memories (SRAM), the like, or a combination thereof. In some alternative embodiments, the electronic components 106 is a graphical processing unit (GPU) chip, power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof.

As illustrated in FIG. 1, the chip package 104 have a rectangular shape in a top view and have a pair of long sides and a pair of short sides according to some embodiments. The chip package 104 may be arranged on a central region of the substrate 102 and the plurality of electronic components 106 may be arranged on the opposite sides of the long sides of the chip package 104, as shown in FIG. 1. In some embodiments, the chip package 104 and the plurality of electronic components 106 include multiple electrical connectors 103 and an underfill 105 thereunder, as shown in FIG. 2A, and are bonded to the substrate 102 to create electrical connections in the form of joints between the chip package 104 and the substrate 102 as well as between the electronic components 106 and the substrate 102. Referring to FIG. 2A, the chip package 104 and the plurality of the electronic components are disposed on and electrical connected to the substrate 102 with a spacing between one another.

A stiffener structure 108 is employed to compensate and reduce the warpage of semiconductor package 100. In some embodiments, the stiffener structure 108 is a structure made from a material such as copper, stainless steel, or any other metallic materials. As shown in FIG. 1, the stiffener structure 108 comprises a stiffener ring 110 and a pair of stiffener ribs 112. It will be appreciated that the stiffener structure 108 may include one stiffener rib or multiple stiffener ribs depending on the arrangements of the chip package 104 and the plurality of electronic components 106; the pair of stiffener ribs as shown in FIGS. 1-12 is merely examples.

The stiffener ring 110 is a rigid tetragonal ring-like structure extending along the perimeter of the substrate 102 and surrounding the chip package 104 and the plurality of electronic components 106. The pair of stiffener ribs 112 extends along the pair of long sides of the chip package 104 and extends from one side of the stiffener ring 110 to another.

Referring to FIG. 2A, the stiffener structure 108 including a stiffener ring 110a and a pair of the stiffener ribs 112a are adhered to the substrate 102 through an adhesive 118. The stiffener ring 110a is located on the periphery of the substrate 102, and the pair of the stiffener ribs 112a is respectively located on the spacings between the chip package 104 and the electronic components 106. Further, the lid 114 is attached on the chip package 104 and the plurality of electronic components 106 as well as the stiffener structure 108 through a thermal interface material (TIM) 116, a TIM 117 and the adhesive 118', respectively. In some embodiments, the lid 114 is a material similar to the material of the stiffener structure 108, such as copper, stainless steel, or any other metallic materials. In some embodiments, the TIM 116 and the TIM 117 are adhesive materials. In some embodiments, the TIM 116 and the TIM 117 include grease-based materials, phase change materials, gels, adhesives, polymeric, metallic materials, or a combination thereof. In some embodiments, the TIM 116 and the TIM 117 include lead-tin based solder (PbSn), silver paste (Ag), gold, tin, gallium, indium, or other suitable thermally conductive materials. Depending on the type of material used, the TIM 116 and the TIM 117 may be formed by deposition, lamination, printing, plating, or any other suitable technique. In some embodiments, the TIM 116 and the TIM 117 include the same material. In some alternative embodiments, the TIM 116 and the TIM 117 include different materials. In some embodiments, the TIM 116 is a film-type TIM. In some other embodiments, the TIM 117 is a gel-type TIM. The adhesive 118 and the adhesive 118' may include an epoxy, a silicon resin, a glue, a thermoset polymer, or the like. In some embodiments, the material of the adhesive 118 is the same as that of the adhesive 118'. In some other embodiments, the material of the adhesive 118 is different from that of the adhesive 118'. In some other embodiments, the adhesive 118 and/or the adhesive 118' have a better adhering ability, than the TIM 116 and the TIM 117.

As illustrated in FIG. 1, a side of the stiffener ring 110 has a width W1 and each of the pair of stiffener ribs 112 has a width W2 from a top view. The width W2 is greater than the width W1. Turning to FIG. 2A, the stiffener ring 110a has a width W3 which is corresponded to the width W1 shown in FIG. 1. Further, each of the pair of stiffener ribs 112a comprises a first portion 112a1 and a second portion 112a2, and the second portion 112a2 is on the first portion 112a1. The first portion 112a1 has a width W4 and the second d portion 112a2 has a width W5 where the width W5 is corresponded to the width W2 shown in FIG. 1. The width W5 of the second portion 112a2 is greater than the width W4 of the first portion 112a1. That is, each of the pair of stiffener ribs 112a has a "T-shaped" structure in a cross-sectional view. As such, the second portion 112a2 has a larger top surface area than that of the first portion 112a1. The larger top surface area of the second portion 112a2 may facilitate better adhesion strength of interface between the stiffener rib 112a and the lid 114, and further reduce the delamination of the TIM 116 between the lid 114 and the chip package 104 as well as the TIM 117 between the lid 114 and the plurality of electronic component 106. In some embodiments, the width W4 of the first portion 112a1 of the stiffener rib 112a is greater than the width W3 of the stiffener ring 110a. In some other embodiments, the width W4 is equal to the width W3.

Referring to FIG. 2A, the stiffener ring 110a has a thickness T1 and each of the pair of stiffener ribs 112a has a thickness T2. The thickness T1 is the same as the thickness T2, as shown in FIG. 2A. Further, the first portion 112a1 has a thickness T3 and the second portion 112a2 has a thickness T4. In some embodiments, the thickness T3 is equal to a thickness T5 of the chip package 104 or a thickness T6 of the plurality of electronic components 106. In some other embodiments, the thickness T3 is greater than the thickness T5 or the thickness T6.

A gap 119 may be consequently formed between the chip package 104 and each of the pair of stiffener ribs 112a. As illustrated in FIG. 2A, a passive component 120 is disposed on the substrate 102 inside the gap 119 according to some embodiments. It will be appreciated that the passive component 120 may be disposed on the substrate 102 between the plurality of electronic components 106 and each of the pair of stiffener ribs 112a, although it is not shown in FIG. 2A. The passive component 120 may include a resistor, an inductor, a capacitor, the like, or a combination thereof. In some embodiments, the second portion 112a2 of each of the pair of stiffener ribs 112a extends over the passive component 120 if the upper space of the gap 119 is not occupied by the passive component 120.

Still referring to FIG. 2A, the lid 114 includes a first recess portion 113, and the first recess portion 113 is located on the bottom of the lid 114 between the chip package 104 and the plurality of electronic components 106. As illustrated in FIG. 2A, the first recess portion 113 has a width W6, the width W6 is greater than the width W5 of the second portion 112a2. Further, the second portion 112a2 is clipped to and inside the first recess portion 113. In some other embodiments, the lid 114 includes a second recess portion 115. The second recess portion 115 is located on the peripheral bottom of the lid 114, as shown in FIG. 2A. Further, the stiffener ring 110a is clipped to and inside the second recess portion 115.

Figure 2B:
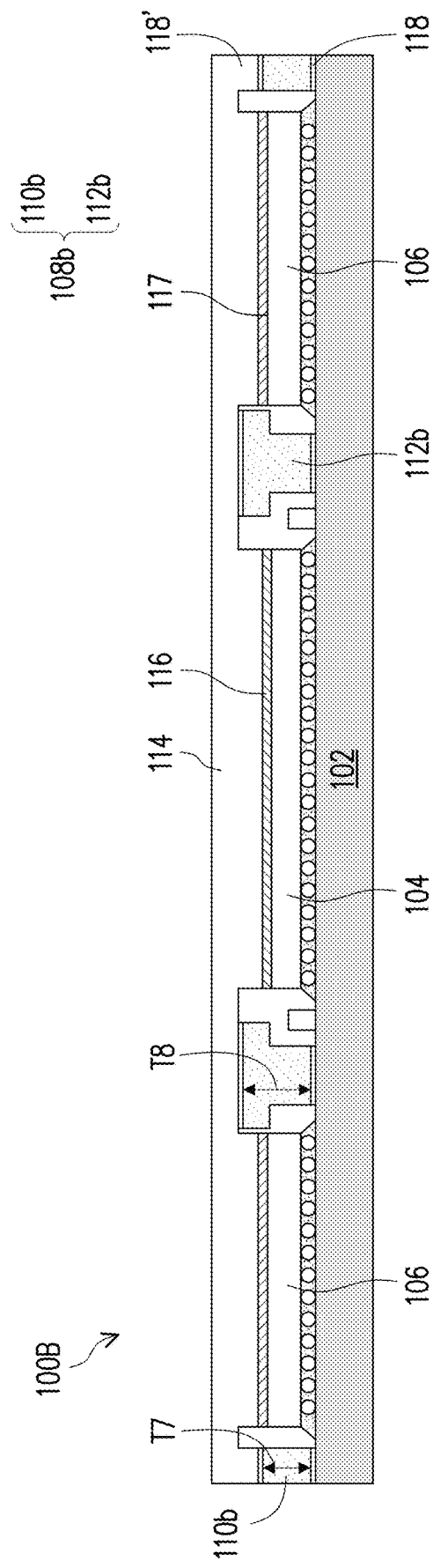
Figure 2C:
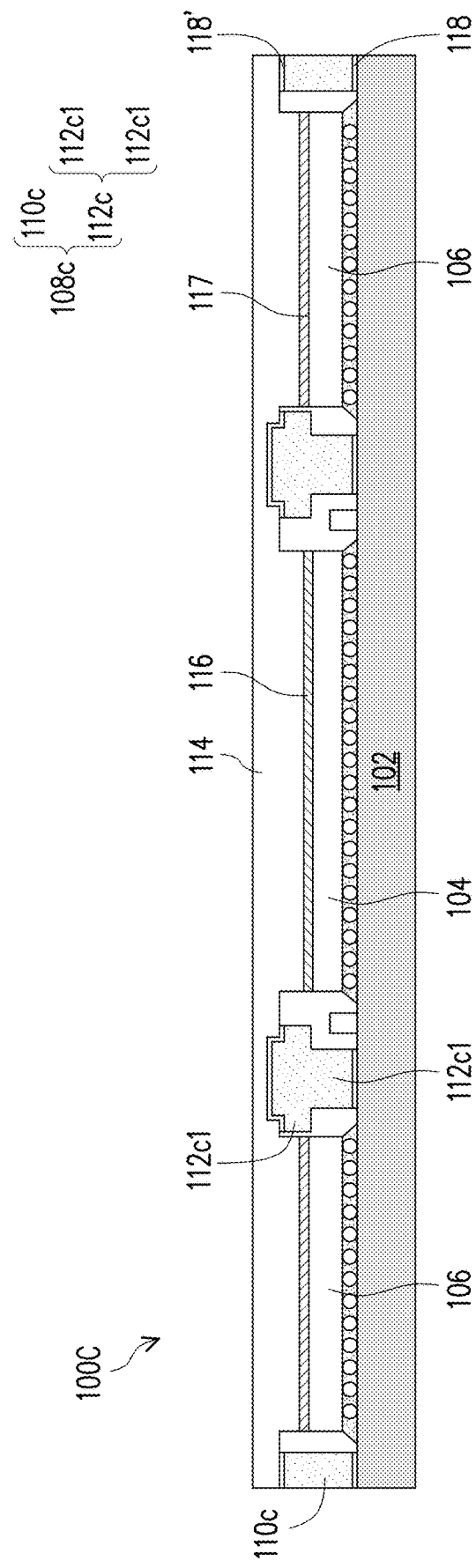
Figure 2D:
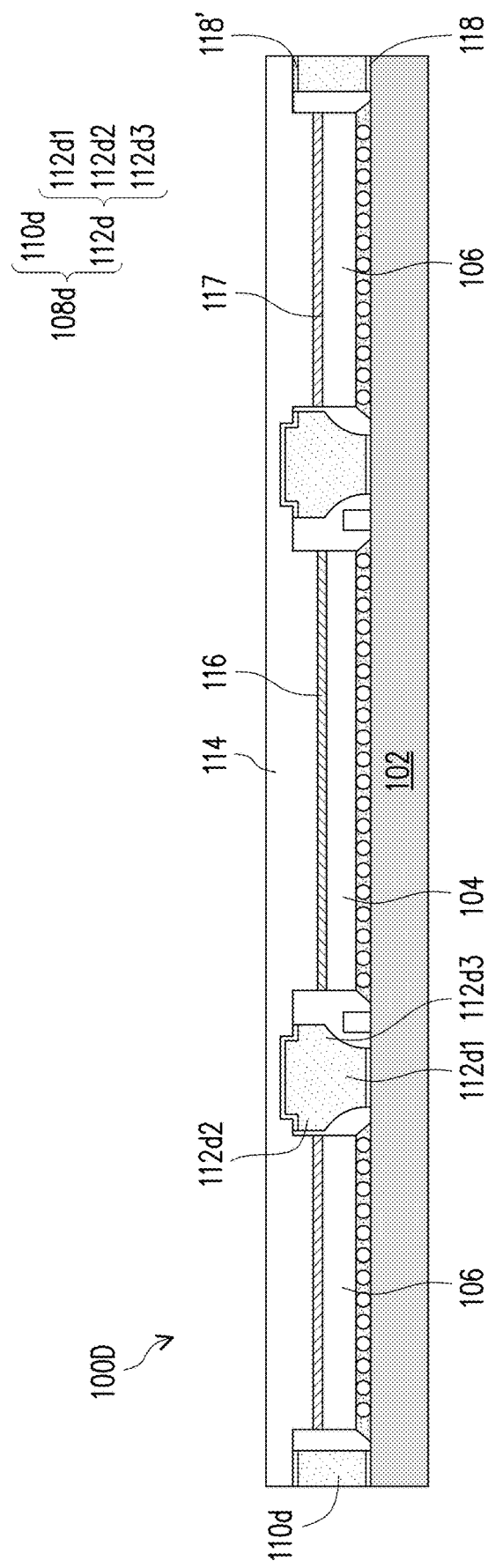

FIG. 2B through 2D are respectively schema cross-sectional views of semiconductor packages with various stiffener ribs along line A-A' shown in FIG. 1 in accordance with some embodiments of the present disclosure. A semiconductor package 100B as shown in FIG. 2B is similar to the semiconductor package 100A discussed with reference to FIG. 2A. The difference therebetween is described; the like or the same parts is not repeated again. In some embodiments, the semiconductor package 100B includes a stiffener structure 108h, and the stiffener structure 108b comprises a stiffener ring 110b and a pair of stiffener ribs 112b. The stiffener ring 110b may have a thickness T7 and each of the pair of stiffener ribs 112b may have a thickness T8. The thickness T7 may be smaller than the thickness T8, as illustrated in FIG. 2B.

Further referring to FIG. 2C, a semiconductor package 100C with different structure of the stiffener rib is provided in accordance with some embodiments. The semiconductor package 100C as shown in FIG. 2C is similar to the semiconductor package 100A discussed with reference to FIG. 2A. The difference therebetween is described; the like or the same parts is not be repeated again. The semiconductor package 100C includes a stiffener structure 108c, and the stiffener structure 108c comprises a stiffener ring 110c and a pair of stiffener ribs 112c. Each of the pair of stiffener ribs 112c further comprises a first portion 112c1 and a second portion 112c2. The first portion 112c1 is similar to the first portion 112a1 as shown in FIG. 2A, and the second portion 112c2 is in a stepped shape. In other words, each of the pair of stiffener ribs 112c has a "T-shaped" structure with a variation of stepped shape on the upper portion. The stepped shape of the second portion 112c2 enlarges the effective top surface area and further increase the coverage of the adhesive 118' applied thereon. Therefore, the adhesion of interface between the lid 114 and the pair of the stiffener ribs 112c may be strengthened, and issues such as delamination of the TIM 116 and the TIM 117 as well as cracking of the adhesive 118' may be reduced accordingly.

Turning to FIG. 2D, a semiconductor package 100D with another different structure of the stiffener rib is provided in accordance with some embodiments. The semiconductor package 100D shown in FIG. 2D is similar to the semiconductor package 100C discussed with reference to FIG. 2C. The difference therebetween is described, the like or the same parts is not repeated again. As shown in FIG. 2D, the semiconductor package 100D includes a stiffener structure 108d, and the stiffener structure 108d comprises a stiffener ring 110d and a pair of stiffener ribs 112d. Each of the pair of the stiffener ribs 112d further comprises a first portion 112d1, a second portion 112d2 and a third portion 112d3. The first portion 112d1 and the second portion 112d2 are similar to those of the stiffener ribs 112c as shown in FIG. 2C. The third portion 112d3 is in a fillet shape and is at both sides of the "T-intersection" structure which is formed by the first portion 112d1 and the second portion 112d2. Such structure enhances the bending strength of each of the pair of stiffener ribs 112d, and further compensates the warpage of the semiconductor package. Therefore, issues such as delamination of the TIM 116 and the TIM 117 as well as cracking of the adhesive 118' may be avoided.

Figure 3:
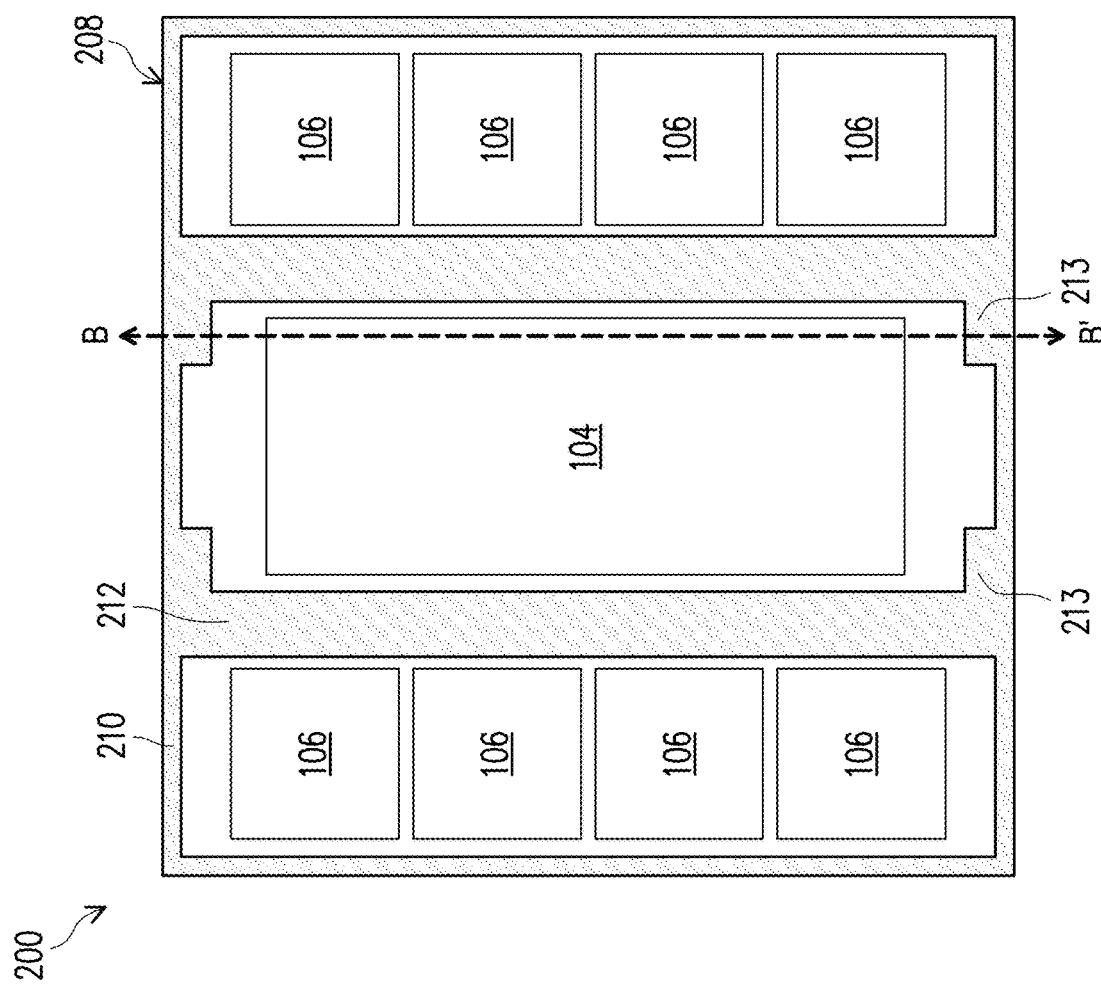
FIG. 3 is a schematic top view of another semiconductor package with a stiffener structure in accordance with some embodiments of the present disclosure.

FIG. 3 is a schematic top view of another semiconductor package with a stiffener structure in accordance with some embodiments of the present disclosure. Referring to FIG. 3, a semiconductor package 200 is provided. The semiconductor package 200 as shown in FIG. 3 is similar to the semiconductor package 100 discussed with reference to FIG. 1. The difference therebetween is described, the like or the same parts is not repeated again. As illustrated in FIG. 3, the semiconductor package 200 includes a stiffener structure 208, and the stiffener structure 208 further comprises a stiffener ring 210, a pair of stiffener ribs 212 and an extension portion 213. The extension portion 213 extends from an edge of the pair of the stiffener ribs 212 and extends towards the central region of the semiconductor package 200.

Figure 4:
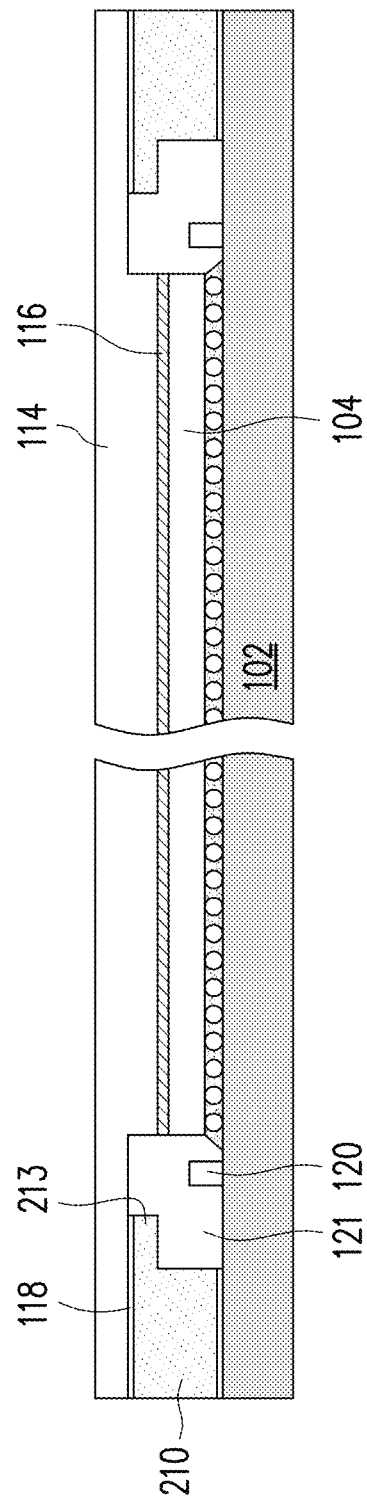
FIG. 4 is a schematic cross-sectional view of another semiconductor package with a stiffener structure along line B-B' shown in FIG. 3 in accordance with some embodiments of the present disclosure.

FIG. 4 is a schematic cross-sectional view of another semiconductor package with a stiffener structure along line B-B' shown in FIG. 3 in accordance with some embodiments of the present disclosure. Referring to FIG. 4, the semiconductor package 200 includes a chip package 104 disposed on and electrically connected to a substrate 102, a stiffener structure 208 adhered to the substrate 102 with an adhesive 118, and a lid 114 attached to the chip package 104 through a TIM 116 as well as to the stiffener structure 208 through the adhesive 118'. The stiffener structure 208 comprises a stiffener ring 210 and an extension portion 213 adjacent to the stiffener ring 210. The extension portion 213 is similar to the second portion 112a2 of the stiffener rib 112a as shown in FIG. 2A, extending within the upper portion. Specifically, the stiffener ring 210 and the extension portion 213 together formed a "L-shape" structure, as illustrated in FIG. 4 in a cross-sectional view. As such, a gap 121 may be formed in the same manner with which is illustrated in FIG. 2A-2D. In some embodiments, a passive component 120 is disposed on the substrate 102 inside the gap 121. In some embodiments, the extension portion 213 extends over the passive component 120 if the upper space of the gap 121 is not occupied by the passive component 120. The extension portion 213 may not extends over the passive component 120 if the upper space of the gap 121 is occupied by the passive component 120.

Figure 5:
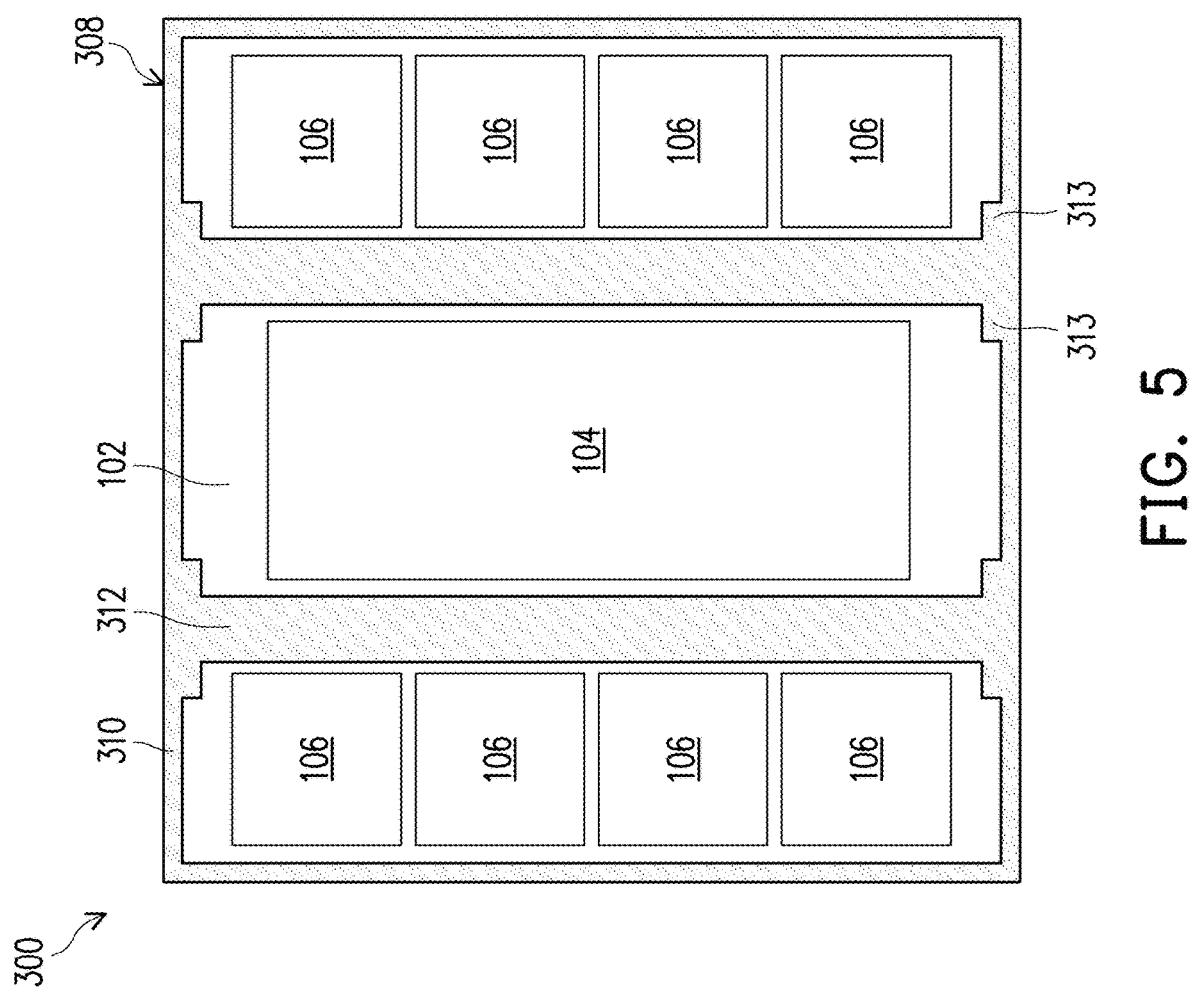
FIGS. 5 through 7 are respectively schema top views of various semiconductor packages with various stiffener structures in accordance with some embodiments of the present disclosure.
Figure 6:
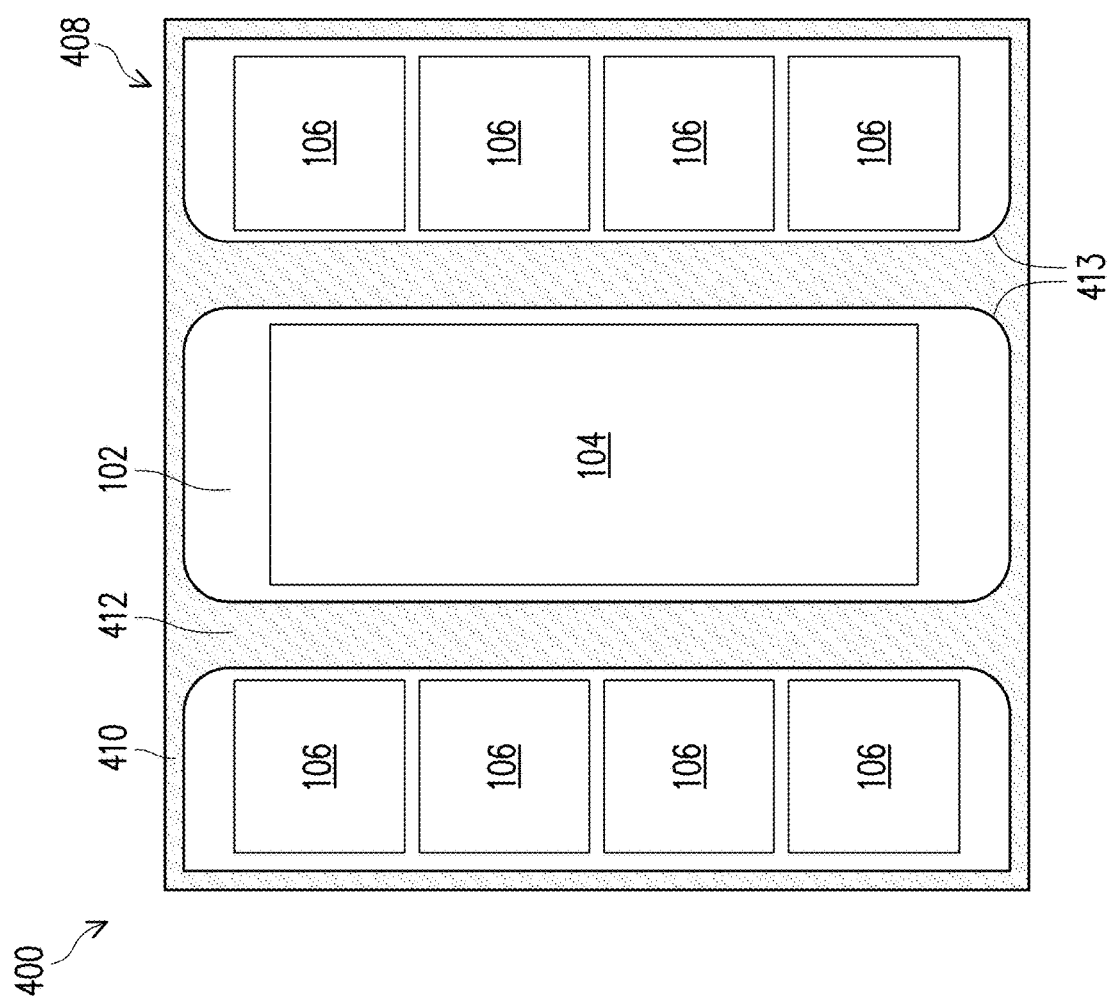
Figure 7:
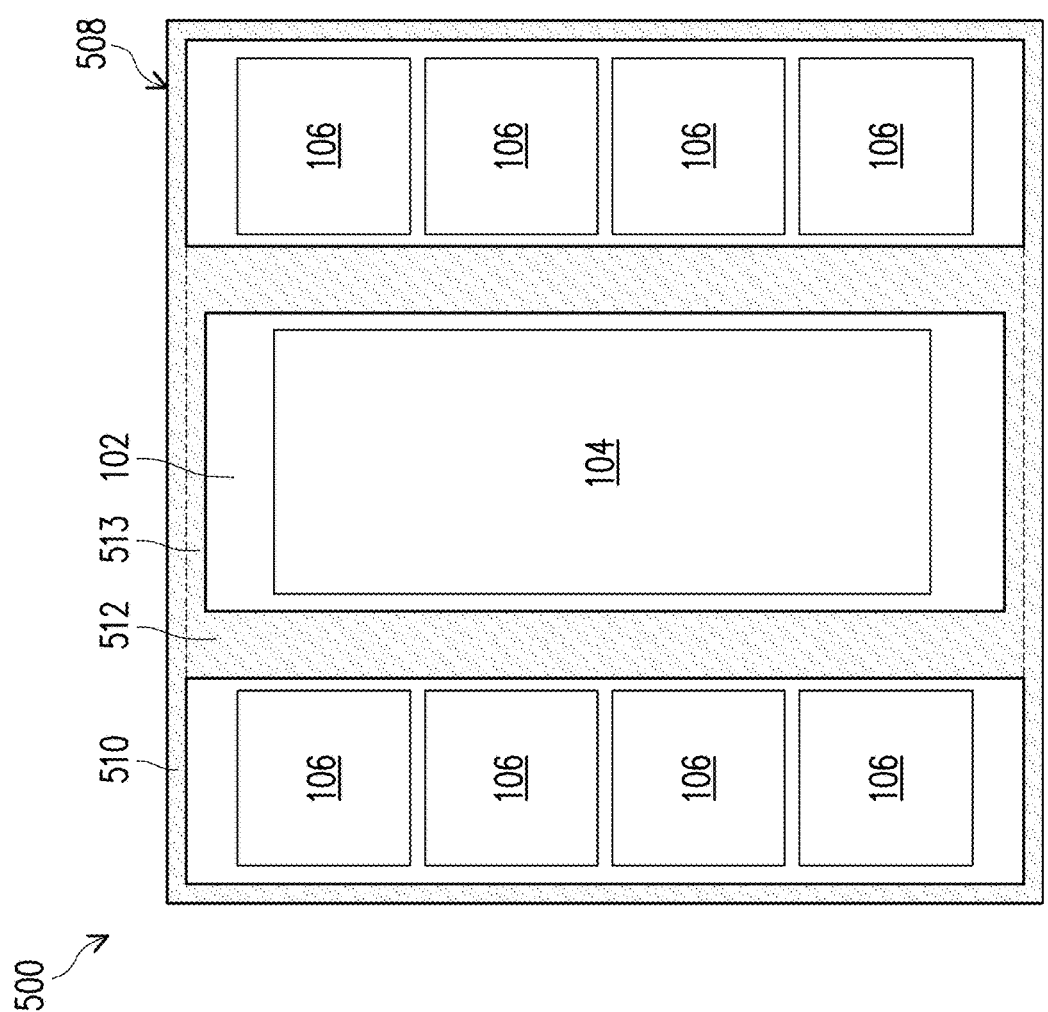

FIGS. 5 through 7 are respectively schematic top views of various semiconductor packages with various stiffener structures in accordance with some other embodiments of the present disclosure. The semiconductor package 300-500 as shown in FIG. 5-7 is similar to the semiconductor package 100 discussed with reference to FIG. 1. The difference therebetween is described, the like or the same parts is not repeated again. Referring to FIG. 5, a semiconductor package 300 includes a stiffener structure 308 is provided. The stiffener structure 308 comprises a stiffener ring 310, a pair of stiffener ribs 312 and an extension portion 313. As shown in FIG. 5, the extension portion 313 extends from each edge of the pair of the stiffener ribs 312 and extends outwards both sides of the stiffener ribs 312, according to some embodiments.

Referring to FIG. 6, a semiconductor package 400 includes a stiffener structure 408 is provided. In some embodiments, the stiffener structure 408 comprises a stiffener ring 410, a pair of stiffener ribs 412 and an extension portion 413. The extension portion 413 extends from an edge of the pair of the stiffener ribs 412 and is in a fillet shape, as illustrated in FIG. 6. Turning to FIG. 7, a semiconductor package 500 includes a stiffener structure 508 is provided. In some embodiments, the stiffener structure 508 comprises a stiffener ring 510, a pair of stiffener ribs 512 and an extension portion 513. As shown in FIG. 7, the extension portion 513 extends from an edge of the pair of stiffener ribs 512 and connects the two of the pair of stiffener ribs 512 by extending along the opposite sides of the stiffener ring 510.

The various stiffener structures with various extension portions shown in FIG. 5-7 enlarge the effective surface area of the respective interface between the lid 114 and the stiffener structure 208-508, resulting in a better adhesion strength of the lid 114 and the respective stiffener structure 208-508. In addition, the extension portion also improves the mechanical strength of the stiffener structures 208-508, respectively. Accordingly, a warpage resulted from CTE mismatch between the lid and the semiconductor devices can be reduced, and issues including delamination of the TIM and/or cracking of the adhesive can be avoided.

Figure 8:
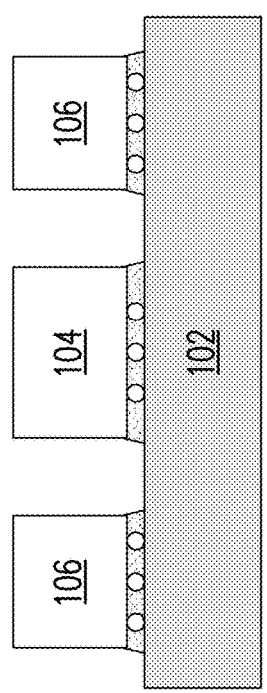

FIGS. 8-12 are a series of respectively schematic cross-sectional views illustrating a method of forming a semiconductor package in accordance with some aspects of the present disclosure. Firstly, referring to FIG. 8, a chip package 104 and a plurality of electronic components 106 are laterally bonding to a substrate 102 with spacings between one another with multiple electrical connectors 103. The electrical connectors 103 may be served as providing electrical connection between the substrate 102 and the chip package 104 as well as the plurality of electronic components 106. The electrical connectors 103, for example, includes metal pads, metal bumps, solder caps, or the like, according to some embodiments. As shown in FIG. 8, an underfill 105 is dispensed into the gap between the chip package 104 and the substrate 102 as well as the gap between the plurality of electronic components 106 and the substrate 102. In some embodiments, the underfill 105 includes a polymer, an epoxy, a molding compound, or the like. A curing step may be performed subsequently to cure the underfill 105 to secure the bonding of the chip package 104 and the plurality of electronic components 106 to the substrate 102. In some embodiments, the curing includes a thermal curing, an ultra-violet (UV) curing, or the like.

Figure 9:
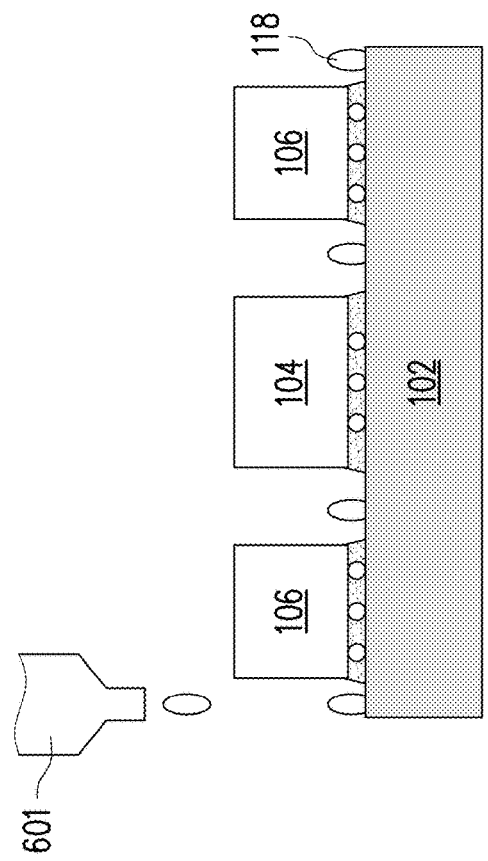
FIGS. 8 through 12 are a series of respectively schematic cross-sectional views illustrating a method of forming a semiconductor package in accordance with some embodiments of the present disclosure.

Referring to FIG. 9, an adhesive 118 is selectively dispensed on the spacings of the substrate 102 between the chip package 104 and the plurality of electronic components 106 by a dispenser 601. In some embodiments, the adhesive 118 includes a polymer material, such as a liquid die attaching film (DAF), a polyimide (PI) based polymer, an epoxy-based polymer, or the like. In some alternative embodiments, the adhesive 118 is free of fillers.

Figure 10:
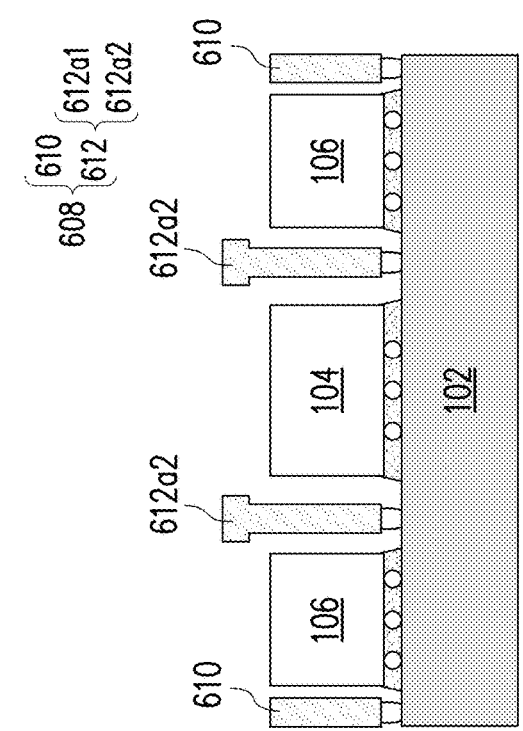

Referring to FIG. 10, a stiffener ring 610 and a pair of stiffener ribs 612 are adhered to the substrate 102 with the adhesive 118, such that a stiffener structure 608 including the stiffener ring 610 and the pair of stiffener ribs 612 is adhered to the substrate 102. In some embodiments, the stiffener structure 608 has a structure similar to the stiffener structure 108-508 in a top view corresponding to FIGS. 1, 3 and 5-7, respectively. In some embodiments, the pair of stiffener ribs 612 has a cross-sectional structure similar to the stiffener ribs 112a-112d illustrated in FIG. 2A-2D. That is, each of the pair of stiffener ribs 612 may comprise a first portion 612a1 similar to the first portion 112a1-112d1 of the stiffener ribs 112a-112d and a second portion 612a2 similar b the second portion 112a2-112d2 of the stiffener ribs 112a-112d. Further, each of the pair od stiffener ribs 612 may comprise a third portion (not shown in FIG. 10) similar to the third portion 112d3 of the stiffener ribs 112d as shown in FIG. 2D. A curing step may be performed afterwards to cure the adhesive 118.

Figure 11:
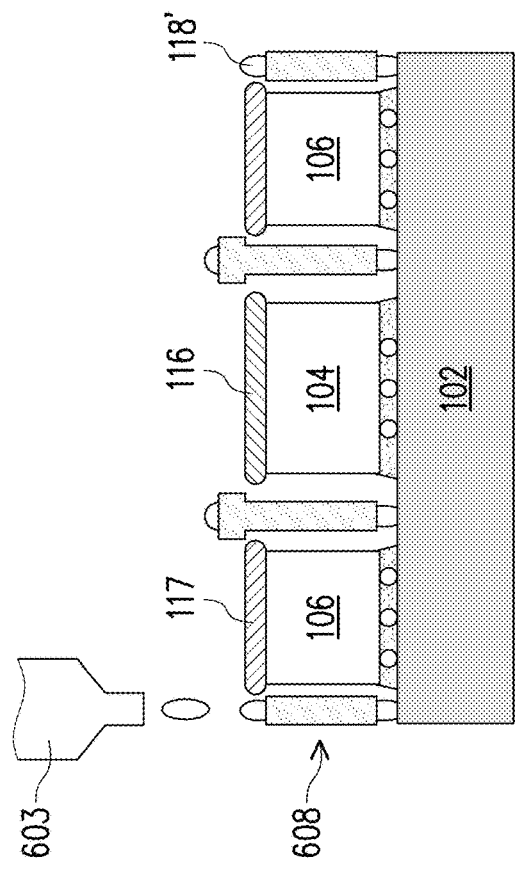

Now turning to FIG. 11, the adhesive 118' is dispensed on the stiffener structure 608 including the stiffener ring 610 and the pair of stiffener ribs 612 by a dispenser 603. A TIM 116 is applied on the chip package 104 and a TIM 117 is applied on the plurality of electronic components 106. In some embodiments, the TIM 116 and the TIM 117 are the same type of TIM, for example, a film-type TIM or a gel-like TIM. In another embodiment, the TIM 116 and the TIM 117 are different types of TIM. In some alternative embodiments, the TIM 116 includes a material with higher thermal conductivity (k) compared to that of the TIM 117.

Figure 12:
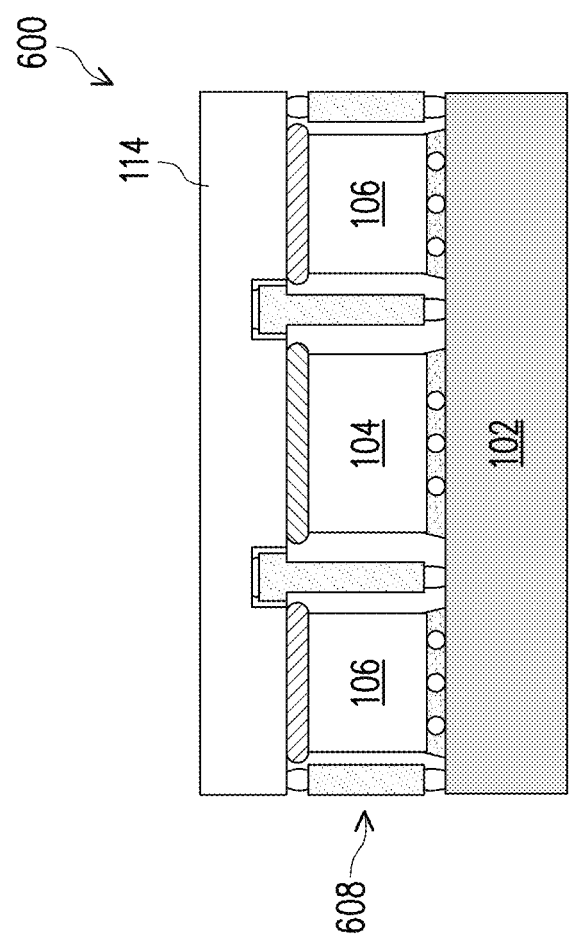

Referring to FIG. 12, a lid 114 is attached to the stiffener structure 608, the chip package 104 and the plurality of electronic components 106. Specifically, the lid 114 is attached to the stiffener structure 608 through the adhesive 118', and attached to the chip package 104 and the plurality of electronic components 106 respectively through the TIM 116 and the TIM 117. As such, the TIM 116 and the TIM 117 thermally couples the chip package 104 and the plurality of electronic components 106 to the lid 114 to dissipate the heat during the operation. A curing step may be performed to further secure the adhesion between the lid 114 to the stiffener structure 608, the chip package 104 and the plurality of electronic components 106.

Up to here, a semiconductor package 600 is formed. The semiconductor package 600 includes the chip package 104 and the plurality of electronic components 106 disposed on the substrate 102, the stiffener structure 608 including the stiffener ring 610 and the pair of stiffener ribs 612 adhered to the substrate 102, and the lid 114 attached to the stiffener structure 608 through the adhesive 118' and to the chip package 104 and the plurality of electronic components 106 through the TIM 116 and the TIM 117. The stiffener ribs 612 may comprise the first portion 612a1 and the second portion 612a2, and the second portion 612a2 may have a larger top surface area than that of the first portion 612a1. The larger top surface area may facilitate a better adhesion strength of interface between the stiffener ribs 612 and the lid 114 and further reduce the delamination of the TIM 116 and the TIM 117 and the cracking of the adhesive 118'.

Figure 13:
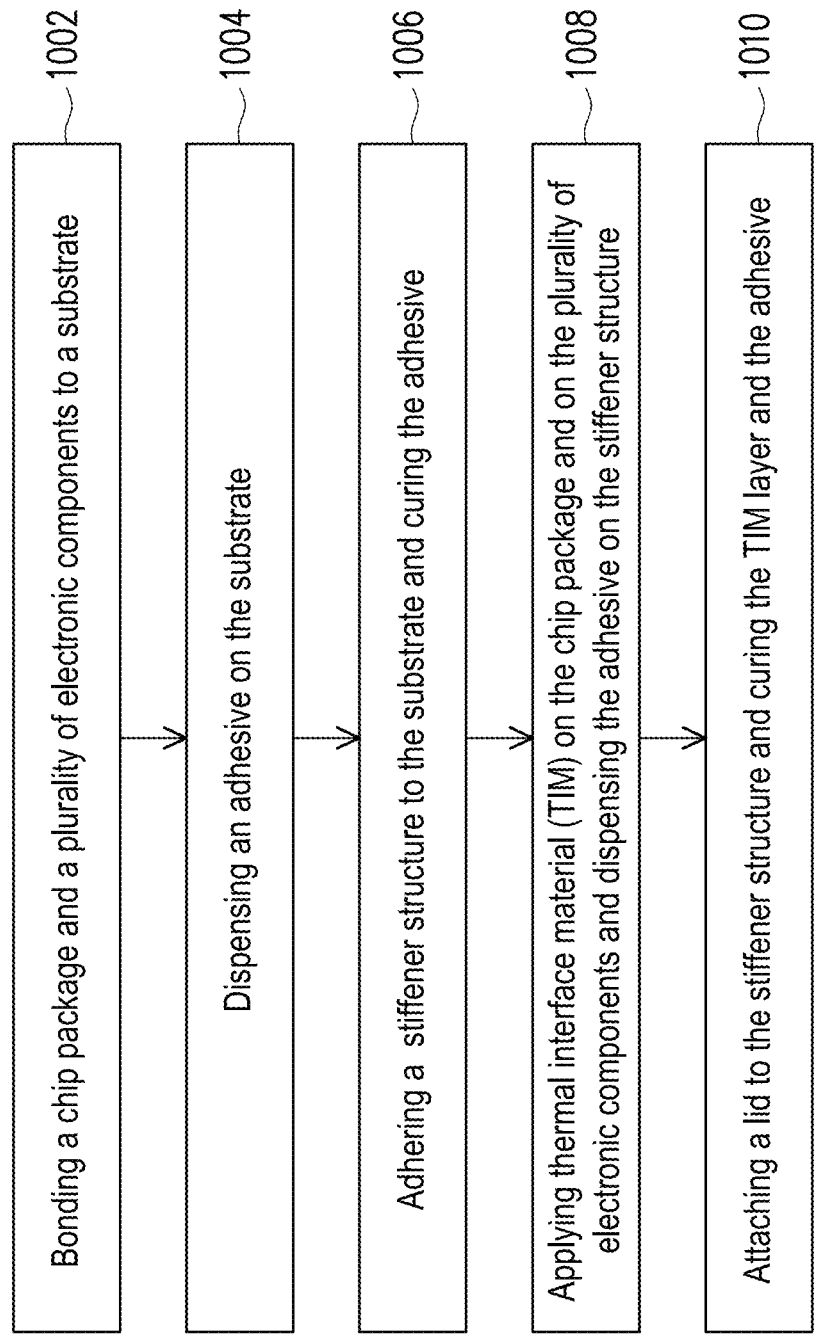
FIG. 13 provides a flow diagram for a method of forming a semiconductor package in accordance with some embodiments of the present disclosure.

FIG. 13 provides a flow diagram for a method of forming a semiconductor package in accordance with some aspects of the present disclosure. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

In act 1002, a chip package and a plurality of electronic components are laterally bonded to a substrate with multiple electrical connectors, and the chip package and the plurality of electronic components are arranged on the substrate with spacing between one another. The electrical connectors may electrically connect the chip package and the plurality of electronic components to the substrate. Further, an underfill may be dispensed into the gap between the chip package and the substrate as well as the gap between the plurality of electronic components and the substrate, followed by a curing step to secure the bonding between the substrate and the components mounted thereon. Thus, some embodiments of act 1002 correspond, for example to FIG. 8.

In act 1004, an adhesive is selectively dispensed on the spacings of the substrate between the chip package and the plurality of electronic components by a dispenser. Thus, some embodiments of act 1004 correspond, for example to FIG. 9.

In act 1006, a stiffener ring and a pair of stiffener ribs are adhered to the substrate with the adhesive, such that a stiffener structure including a stiffener ring and a pair of stiffener ribs are adhered to the substrate. Additionally, the stiffener ribs may comprise a first portion and a second portion, wherein a width of the second portion is greater than a width of the first portion. A curing step to cure the adhesive is performed thereafter. Thus, some embodiments of act 1006 correspond, for example to FIG. 10.

In act 1008, a thermal interface material (TIM) is applied on the chip package and the plurality of electronic components, and an adhesive is dispensed on the stiffener structure. The TIM on the chip package and the TIM on the plurality of electronic components may be the same type or the different type of TIM. Thus, some embodiments of act 1008 correspond, for example to FIG. 11.

In act 1010, a lid is attached on the chip package and the plurality of electronic components through the TIM as well as on the stiffener structure through the adhesive. A semiconductor package is formed thereby. Thus, some embodiments of act 1010 correspond, for example to FIG. 12.

In an aspect of the present disclosure, a semiconductor package is provided. The semiconductor package comprises a chip package disposed on a substrate, a plurality of electronic components disposed aside the chip package on the substrate and a stiffener structure disposed on the substrate. The stiffener structure comprises a stiffener ring surrounding the chip package and the plurality of electronic components, a stiffener rib between the chip package and the plurality of electronic components, wherein the stiffener rib comprises a first portion and a second portion on the first portion, and a width of the second portion is greater than a width of the first portion. The semiconductor package further comprises a lid attached to the stiffener structure, the chip package and the plurality of electronic components.

In another aspect of the present disclosure, a semiconductor package is provided. The semiconductor package comprises a package and a plurality dies disposed on and electrically connected to a substrate and a stiffener structure adhered to the substrate. The stiffener structure comprises a stiffener ring and a pair of stiffener ribs, wherein the pair of stiffener ribs has a top surface area and a bottom surface area, and the top surface area is greater than the bottom surface area. The semiconductor package further comprises a lid attached to the package, the plurality of dies and the stiffener structure.

In yet another aspect of the present disclosure, a manufacturing method of a semiconductor package is provided. The manufacturing method of the semiconductor package comprises: bonding a chip package and a plurality of electronic components to a substrate with a spacing between one another; adhering a stiffener structure to the substrate between the chip package and the plurality of electronic components, wherein the stiffener structure comprises a stiffener ring and a pair of stiffener ribs, and the pair of stiffener ribs comprises a first portion and a second portion on the first portion, wherein the second portion is wider than the first portion; attaching a lid to the chip package and the plurality of electronic components and the stiffener structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a chip package, disposed on a substrate;
   a plurality of electronic components, disposed aside the chip package on the substrate;
   a stiffener structure, disposed on the substrate, the stiffener structure comprising:
      a stiffener ring surrounding the chip package and the plurality of electronic components;
      a stiffener rib between the chip package and the plurality of electronic components, wherein the stiffener rib comprises a first portion and a second portion on the first portion, and a width of the second portion is greater than a width of the first portion; and
   a lid, attached to the stiffener structure, the chip package and the plurality of electronic components,
   wherein the lid comprises a first recess portion over the stiffener rib, and a plurality of sidewalls of the lid exposed by the first recess portion surround the second portion of the stiffener rib.

2. The semiconductor package of claim 1, wherein the chip package has a pair of short sides and a pair of long sides, and the plurality of electronic components is arranged on opposite sides of the long sides of the chip package.

3. The semiconductor package of claim 2, wherein the stiffener rib extends along the pair of long sides of the chip package and extends from one side of the stiffener ring to another.

4. The semiconductor package of claim 1, further comprising a passive component disposed between the substrate and the first recess portion of the lid.

5. The semiconductor package of claim 4, wherein the second portion of the pair of stiffener ribs extends over the passive component.

6. The semiconductor package of claim 1, wherein a thickness of the stiffener rib is equal to or greater than a thickness of the stiffener ring.

7. The semiconductor package of claim 6, wherein the thickness of the stiffener rib is greater than a thickness of the chip package or a thickness of the plurality of electronic components.

8. The semiconductor package of claim 1, wherein a thickness of the first portion of the stiffener rib is equal to or greater than the thickness of the chip package or the thickness of the plurality of electronic components.

9. The semiconductor package of claim 1, wherein the lid further comprises a second recess portion located on the stiffener ring.

10. The semiconductor package of claim 1, wherein a width of the first recess portion of the lid is greater than the width of the second portion of the stiffener rib.

11. The semiconductor package of claim 1, wherein the second portion of the stiffener rib is clipped to and inside the first recess portion of the lid, and a plurality of sidewalls of the second portion of the stiffener rib are surround by the lid.

12. The semiconductor package of claim 1, wherein the second portion of the stiffener rib is in a stepped shape, and the first recess portion of the lid on the stiffener rib has a shape corresponding to the stepped shape, and the stiffener rib is adhered to the lid through an adhesive.

13. The semiconductor package of claim 1, wherein the stiffener rib further comprises a third portion, the third portion is in a fillet shape and is at both sides of a intersection formed by the first portion and the second portion.

14. A semiconductor package, comprising:
a package and a plurality of dies, disposed on and electrically connected to a substrate;
a stiffener structure, adhered to the substrate, the stiffener structure comprising:
a stiffener ring; and
a pair of stiffener ribs, wherein the pair of stiffener ribs has a top surface area and a bottom surface area, and the top surface area is greater than the bottom surface area; and
a lid, attached to the package, the plurality of dies and the stiffener structure,
wherein distances between bottoms of the lid on the pair of stiffener ribs of the stiffener structure and the substrate are greater than a distance between a bottom of the lid on the package and the substrate, and greater than distances between bottoms of the lid on the plurality of dies and the substrate.

15. The semiconductor package of claim 14, wherein the stiffener structure further comprises an extension portion extending from an edge of the pair of stiffener ribs and extending towards a central region of the semiconductor package.

16. The semiconductor package of claim 14, wherein the stiffener structure further comprises an extension portion extending from an edge of the pair of the stiffener ribs and extending outwards both sides of the pair of stiffener ribs.

17. The semiconductor package of claim 14, wherein the stiffener structure further comprises an extension portion extending from an edge of the pair of the stiffener ribs and the extension portion is in a fillet shape.

18. The semiconductor package of claim 14, wherein the stiffener structure further comprises an extension portion extending from an edge of the pair of stiffener ribs and connecting the two of the pair of the stiffener ribs by extending along a side of the stiffener ring.

19. A manufacturing method of a semiconductor package, comprising:
bonding a chip package on a substrate;
bonding a plurality of electronic components aside the chip package on the substrate;
adhering a stiffener structure on the substrate, the stiffener structure comprising:
a stiffener ring surrounding the chip package and the plurality of electronic components;
a stiffener rib between the chip package and the plurality of electronic components, wherein the stiffener rib comprises a first portion and a second portion on the first portion, and a width of the second portion is greater than a width of the first portion; and
attaching a lid to the stiffener structure, the chip package and the plurality of electronic components,
wherein the lid comprises a first recess portion located on the stiffener rib, and a plurality of sidewalls of the lid exposed by the first recess portion surround the second portion of the stiffener rib.

20. The manufacturing method of claim 19, wherein the stiffener structure is adhered to the substrate through an adhesive, and an adhesive coverage on the second portion of the pair of stiffener structure is greater than an adhesive coverage on the stiffener ring.

* * * * *